(12) United States Patent
Endo

(10) Patent No.: US 10,615,042 B2
(45) Date of Patent: Apr. 7, 2020

(54) METHOD OF MANUFACTURING SEMICONDUCTOR APPARATUS

(71) Applicant: CANON KABUSHIKI KAISHA, Tokyo (JP)

(72) Inventor: Nobuyuki Endo, Fujisawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 31 days.

(21) Appl. No.: 15/969,571

(22) Filed: May 2, 2018

(65) Prior Publication Data
US 2018/0330952 A1  Nov. 15, 2018

(30) Foreign Application Priority Data

May 12, 2017  (JP) ................................. 2017-095951

(51) Int. Cl.
*H01L 21/28* (2006.01)
*H01L 27/146* (2006.01)
(Continued)

(52) U.S. Cl.
CPC .... *H01L 21/28123* (2013.01); *H01L 21/3083* (2013.01); *H01L 21/31144* (2013.01); *H01L 21/32137* (2013.01); *H01L 21/32139* (2013.01); *H01L 21/78* (2013.01); *H01L 23/544* (2013.01); *H01L 27/146* (2013.01); *H01L 27/14612* (2013.01); *H01L 27/14683* (2013.01); *H01L 27/14689* (2013.01); *H01L 2223/54426* (2013.01)

(58) Field of Classification Search
CPC ................... H01L 21/28123; H01L 27/14612
See application file for complete search history.

(56) References Cited

U.S. PATENT DOCUMENTS

2001/0033995 A1* 10/2001 Tanaka ...................... G03F 1/30
430/311
2005/0207011 A1*  9/2005 Ito ............................ G02B 5/18
359/569
(Continued)

FOREIGN PATENT DOCUMENTS

JP          11-220116 A       8/1999
JP          2004-29482 A      1/2004
(Continued)

*Primary Examiner* — Moazzam Hossain
*Assistant Examiner* — Hajar Kolahdouzan
(74) *Attorney, Agent, or Firm* — Canon U.S.A., Inc. IP Division

(57) ABSTRACT

A method of manufacturing a semiconductor apparatus comprises forming a first photoresist on each of a first portion and a second portion of a member, exposing the first photoresist on the first portion using a first photomask, exposing the first photoresist on the second portion using a second photomask, forming a first resist pattern by developing the first photoresist on the first portion and the second portion, etching the first portion and the second portion using the first resist pattern as a mask, forming a second photoresist on a third portion of the member, exposing the second photoresist on the third portion using a third photomask, forming a second resist pattern by developing the second photoresist on the third portion, and etching the third portion using the second resist pattern as a mask.

20 Claims, 5 Drawing Sheets

(51) Int. Cl.
*H01L 21/78* (2006.01)
*H01L 21/3213* (2006.01)
*H01L 21/311* (2006.01)
*H01L 21/308* (2006.01)
*H01L 23/544* (2006.01)

(56) References Cited

U.S. PATENT DOCUMENTS

2007/0196986 A1\* 8/2007 Ichige .................. H01L 27/105
  438/266
2008/0311527 A1\* 12/2008 Kim ...................... G03F 7/2022
  430/313
2016/0141320 A1\* 5/2016 Tu ..................... H01L 27/14618
  257/432

FOREIGN PATENT DOCUMENTS

| JP | 2007-227454 A | 9/2007 |
| JP | 2012-147001 A | 8/2012 |
| JP | 2014-74904 A  | 4/2014 |

\* cited by examiner

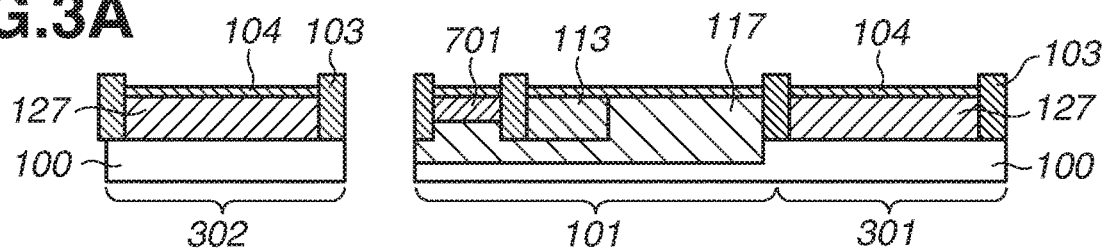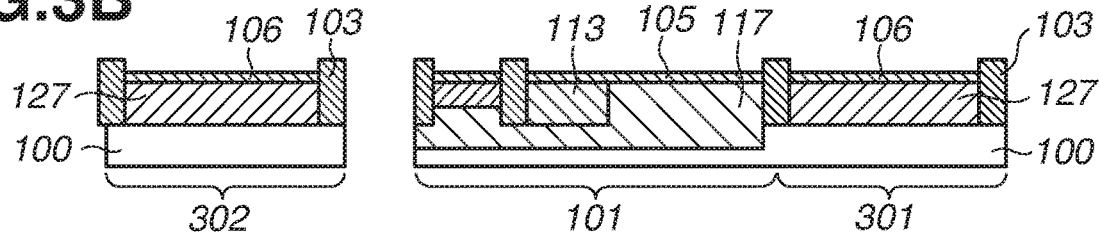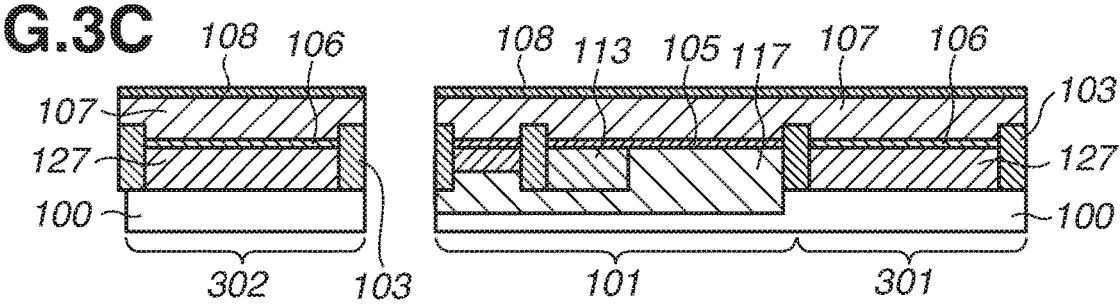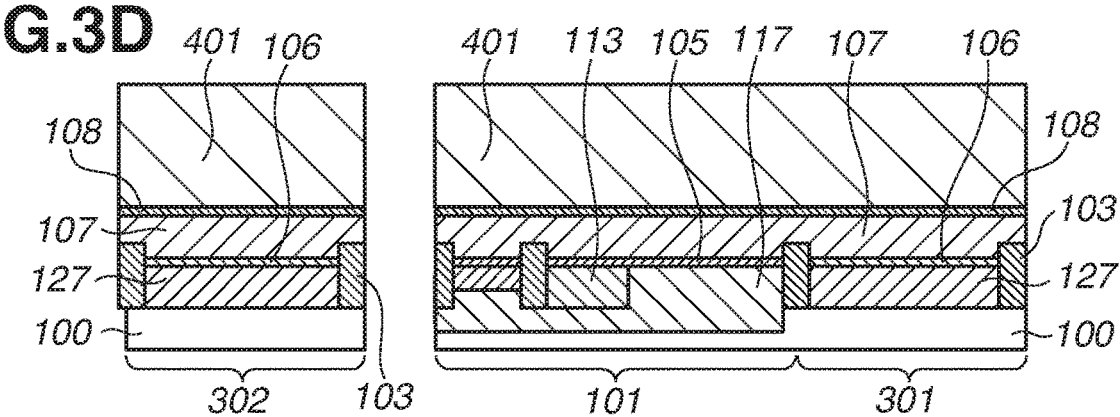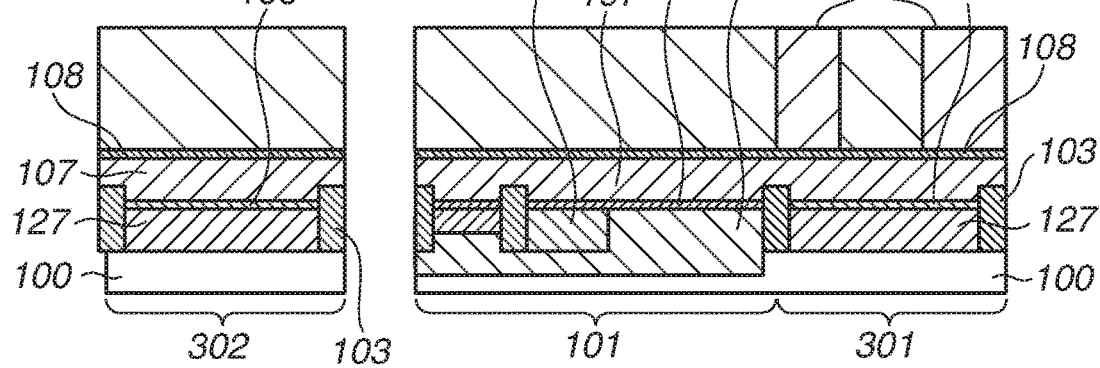

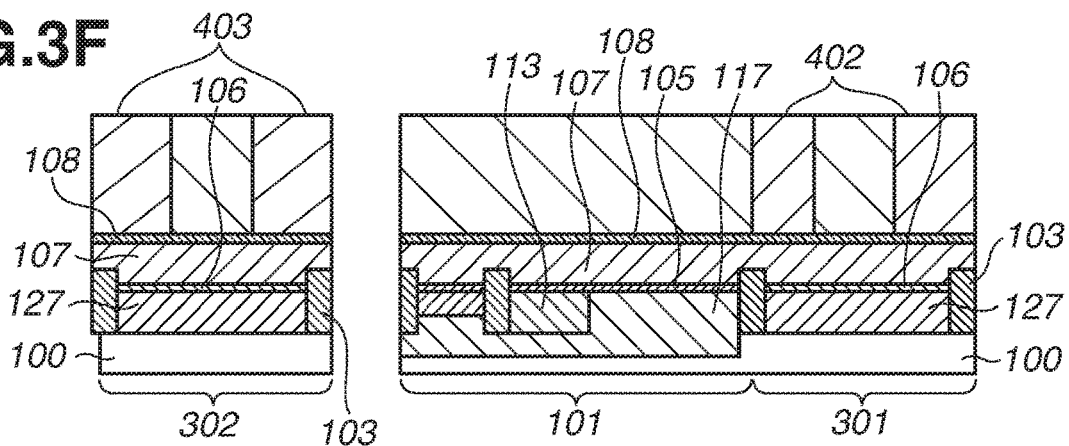
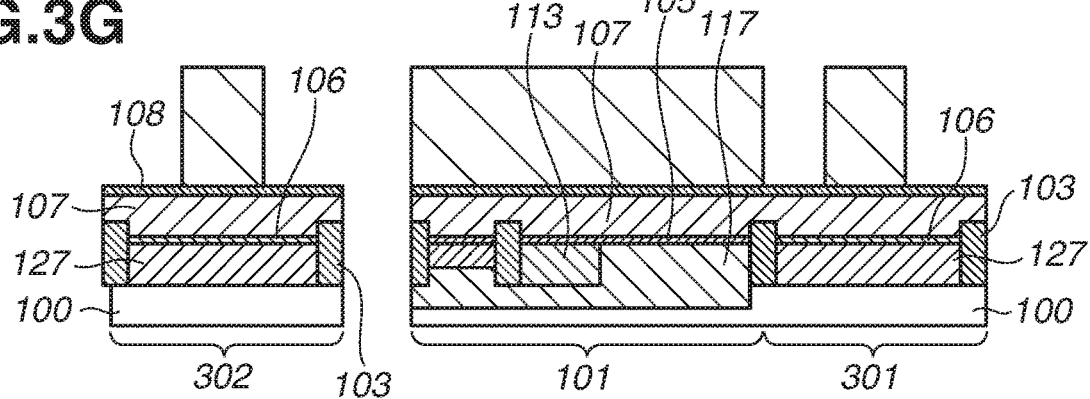
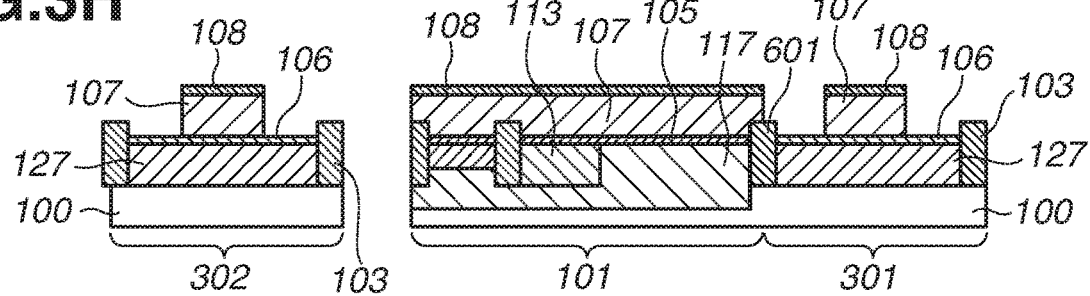
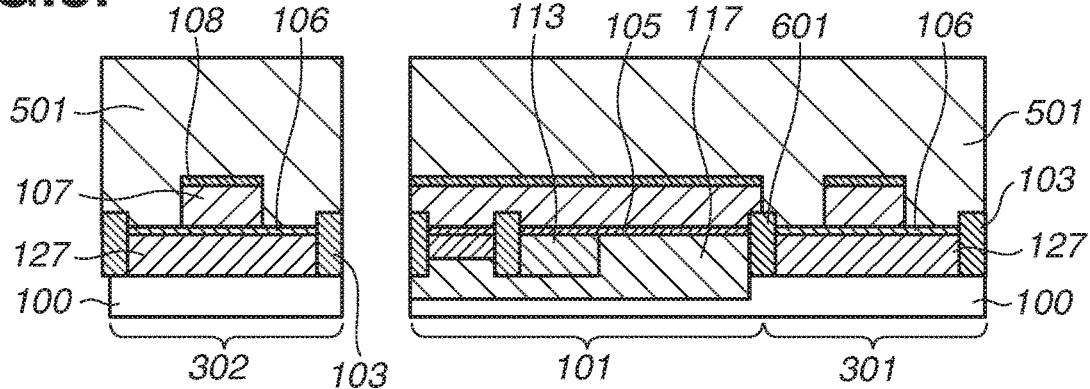

METHOD OF MANUFACTURING SEMICONDUCTOR APPARATUS

BACKGROUND OF THE INVENTION

Field of the Invention

The aspect of the embodiments relates to a method of manufacturing a semiconductor apparatus.

Description of the Related Art

In manufacturing a photoelectric conversion apparatus having a large size, an exposure region by photolithography is divided (hereinafter, referred to as "division exposure"), which makes it possible to manufacture a photoelectric conversion apparatus that includes an area larger than the maximum exposure range (screen size) of an exposure apparatus.

Japanese Patent Application Laid-Open No. H11-220116 discusses a method of manufacturing a solid-state imaging device. The method includes performing exposure with use of a first photomask for a light receiving section and performing exposure with use of a second photomask for a peripheral circuit section.

In Japanese Patent Application Laid-Open No. H11-220116, processing after the division exposure is not discussed in detail. The characteristics may be deteriorated depending on the processing after the division exposure. Therefore, there is an issue that performance of a semiconductor apparatus as the photoelectric conversion apparatus is not sufficiently improved.

SUMMARY OF THE INVENTION

According to an aspect of the embodiments, a method of manufacturing a semiconductor apparatus including a first circuit section and a second circuit section includes forming a first photoresist on each of a first portion and a second portion of a member, the first portion and the second portion being for the first circuit section, exposing the first photoresist on the first portion using a first photomask, exposing the first photoresist on the second portion using a second photomask, forming a first resist pattern by developing the first photoresist on the first portion and the second portion, etching the first portion and the second portion using the first resist pattern as a mask, forming a second photoresist on a third portion of the member, the third portion being for the second circuit section, exposing the second photoresist on the third portion using a third photomask, forming a second resist pattern by developing the second photoresist on the third portion, and etching the third portion using the second resist pattern as a mask.

Further features of the disclosure will become apparent from the following description of exemplary embodiments with reference to the attached drawings.

BRIEF DESCRIPTION OF THE DRAWINGS

FIGS. 3A to 3M are schematic diagrams to explain the method of manufacturing the photoelectric conversion apparatus.

DESCRIPTION OF THE EMBODIMENTS

Figure 1A:
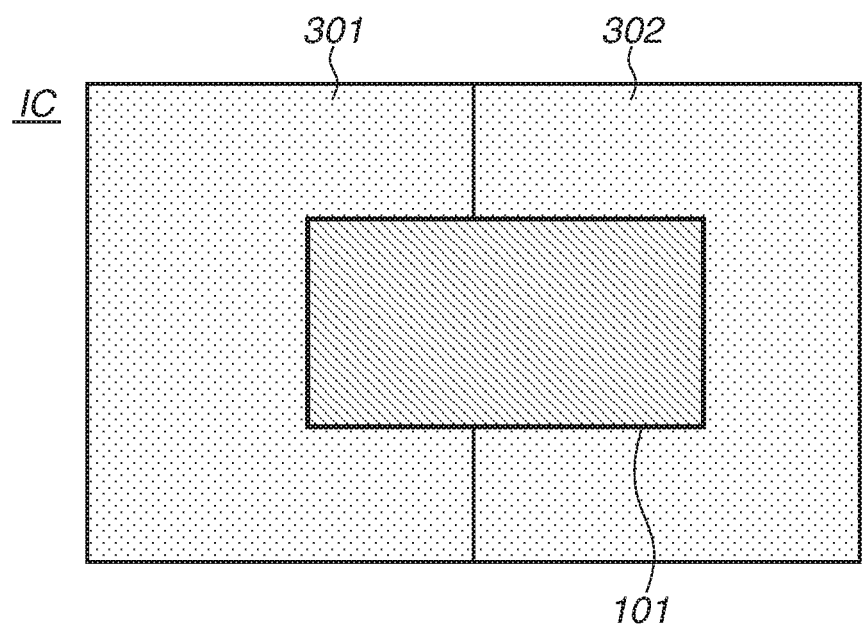
FIGS. 1A and 1B are schematic diagrams to explain a photoelectric conversion apparatus.

An exemplary embodiment of the disclosure is described below with reference to drawings. In the following description and drawings, a component common to a plurality of drawings is denoted by a common reference numeral. Accordingly, the common component is described with mutually referring the plurality of drawings, and description of the component denoted by the common reference numeral is appropriately omitted.

FIG. 1A is a schematic plan view of a photoelectric conversion apparatus IC. The photoelectric conversion apparatus IC is a semiconductor apparatus including at least a semiconductor chip. The semiconductor chip suitable in the present exemplary embodiment includes a quadrilateral shape in which a short side has a length larger than 26 mm and a long side has a length larger than 33 mm. The semiconductor chip more suitable in the present exemplary embodiment includes a quadrilateral shape in which a short side has a length equal to or larger than 30 mm and a long side has a length equal to or larger than 40 mm. Further, according to the present exemplary embodiment, the semiconductor chip can include a quadrilateral shape in which a short side has a length larger than 33 mm and a long side has a length larger than 42 mm.

The photoelectric conversion apparatus IC includes a pixel circuit section 101, and a peripheral circuit section 301 and a peripheral circuit section 302 both located around the pixel circuit section 101. The pixel circuit section 101 is located between the peripheral circuit section 301 and the peripheral circuit section 302. As described above, using a large-area semiconductor chip in which a short side has a length larger than 26 mm and a long side has a length larger than 33 mm makes it possible to improve performance of the photoelectric conversion apparatus, because space limitation when characteristics of the pixel circuit section and the peripheral circuit sections are enhanced is reduced.

Figure 1B:
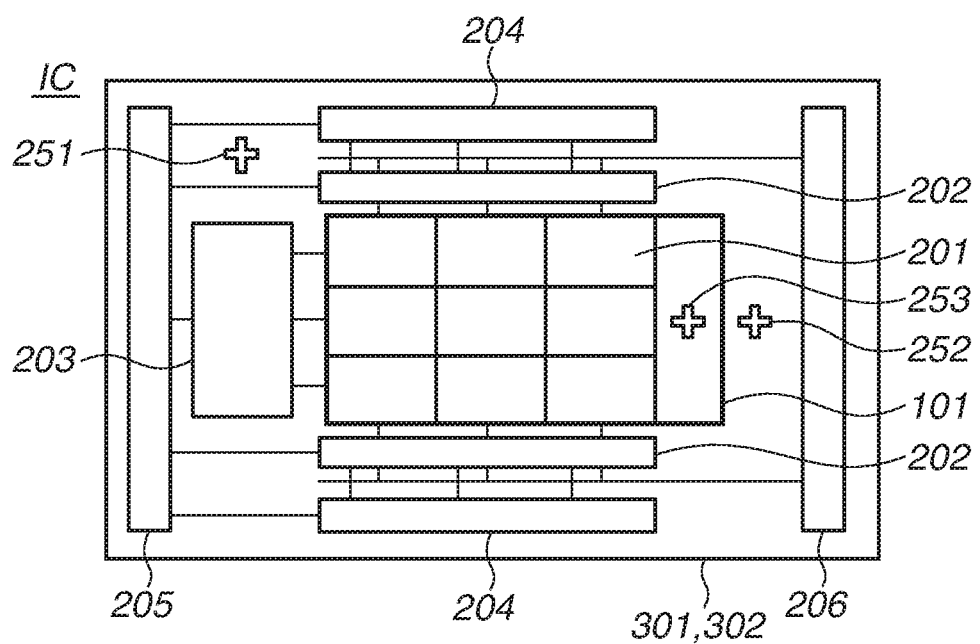

FIG. 1B is a circuit arrangement diagram of the photoelectric conversion apparatus IC. A pixel circuit 201 of the pixel circuit section 101 is a minimum unit of a photoelectric conversion device and a device set to read a signal from the photoelectric conversion device to an output line. The device set includes, for example, a transfer transistor, an amplification transistor, and a rest transistor. The above-described devices can be shared by adjacent photoelectric conversion devices. Also in this case, a minimum unit of the device set to read a signal of one photoelectric conversion device is defined as a pixel circuit.

A signal processing circuit 202 processes a signal read out from the pixel circuit section 101. The signal processing circuit 202 can include an amplification circuit, a correlated double sampling (CDS) circuit, and an analog-digital conversion circuit. A vertical driving circuit 203 drives transistors disposed in the pixel circuit section 101. A horizontal driving circuit 204 drives a transistor in the signal processing circuit 202. A control circuit 205 generates a signal to control each of the signal processing circuit 202, the vertical driving circuit 203, and the horizontal driving circuit 204. An output circuit 206 converts the signal processed by the signal processing circuit 202 into a signal suitable as an output signal from the photoelectric conversion apparatus IC. The output circuit 206 includes a parallel-serial conversion circuit and a circuit to perform differential transmission. The signal processing circuit 202, the vertical driving circuit 203, the horizontal driving circuit 204, the control circuit 205, and the output circuit 206 are included in the peripheral circuit section 301 or the peripheral circuit section 302.

Alignment marks 251, 252, and 253 are used in manufacturing and may not be provided in the photoelectric conversion apparatus IC because the alignment marks can be disposed in a scribe region.

A method of manufacturing the photoelectric conversion apparatus IC according to the present exemplary embodiment is descried with reference to FIGS. 2A to 2K. To manufacture the photoelectric conversion apparatus IC, a plurality of device regions each becoming the photoelectric conversion apparatus IC is formed on a semiconductor wafer. The semiconductor wafer is diced for each device region along a scribe region between the device regions. A plurality of semiconductor chips are obtained through dicing. Each of the semiconductor chips is packaged as necessary. As a result, the photoelectric conversion apparatus IC is obtained. In the following, the semiconductor wafer is referred to as a base body 10, and manufacturing processes before dicing in the method of manufacturing the photoelectric conversion apparatus IC are described.

Figure 2A:
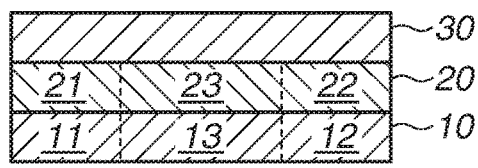
FIGS. 2A to 2K are schematic diagrams to explain a method of manufacturing the photoelectric conversion apparatus.

FIG. 2A illustrates the base body 10 and a member to be processed 20 disposed on the base body 10. The base body 10 includes a peripheral circuit region 11 finally becoming the peripheral circuit section 301, a peripheral circuit region 12 finally becoming the peripheral circuit section 302, and a pixel circuit region 13 finally becoming the pixel circuit section 101. In addition, the member to be processed 20 includes a peripheral portion 21 including a portion finally becoming the peripheral circuit section 301, a peripheral portion 22 including a portion finally becoming the peripheral circuit section 302, and a center portion 23 including a portion finally becoming the pixel circuit section 101. The peripheral portion 21 is located on the peripheral circuit region 11, the peripheral portion 22 is located on the peripheral circuit region 12, and the center portion 23 is located on the pixel circuit region 13.

FIG. 2A illustrates a process "a" of forming a photoresist 30 on the peripheral portion 21 and the peripheral portion 22 of the member to be processed 20. The photoresist 30 is formed on the center portion 23 as well.

Figure 2B:
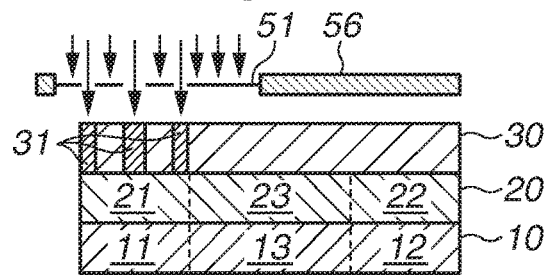

FIG. 2B illustrates a process "b" of exposing the photoresist 30 on the peripheral portion 21 with use of a photomask 51. An exposed portion 31 is formed in the photoresist 30 through the exposure in the process "b". In the process "b", only the photoresist 30 within the maximum exposure range of the exposure apparatus is exposed with use of the photomask 51, and a portion of the photoresist 30 corresponding to a non-exposure range 56 of the exposure apparatus is not exposed. In this case, the schematic illustration is given on an assumption of unmagnification exposure; however, reduction projection exposure can be actually performed. The exposure apparatus can be a stepper or a scanner. It is true of the following exposure processes.

Figure 2C:
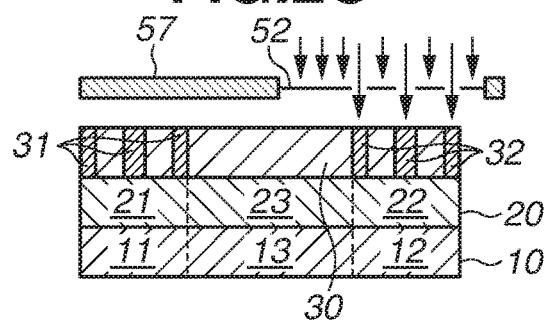

FIG. 2C illustrates a process "c" of exposing the photoresist 30 on the peripheral portion 22 with use of a photomask 52. An exposed portion 32 is formed in the photoresist 30 through the exposure in the process "c". In the process "c", only the photoresist 30 within the maximum exposure range of the exposure apparatus is exposed with use of the photomask 52, and a portion of the photoresist 30 corresponding to a non-exposure range 57 of the exposure apparatus is not exposed.

Figure 2D:
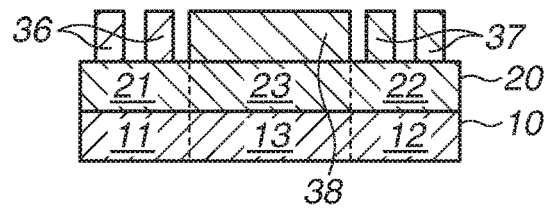

FIG. 2D illustrates a process "d" of developing the photoresist 30 to form resist patterns 36, 37, and 38 on the peripheral portion 21 and the peripheral portion 22. The resist pattern 36 is formed through removal of the exposed portion 31, and the resist pattern 37 is formed through removal of the exposed portion 32. In the process "d", the resist pattern 38 is also formed from a non-exposed portion of the photoresist 30 on the center portion 23.

Figure 2E:
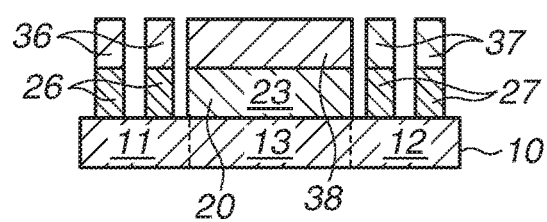

FIG. 2E illustrates a process "e" of etching the peripheral portion 21 and the peripheral portion 22 with use of the resist patterns 36, 37, and 38 as a mask. A constituent member 26 configuring the peripheral circuit section 301 is formed on the peripheral circuit region 11 from the peripheral portion 21 through the etching in the process "e". Further, a constituent member 27 configuring the peripheral circuit section 302 is formed on the peripheral circuit region 12 from the peripheral portion 22. The center portion 23 of the member to be processed 20 masked by the resist pattern 38 remains.

Figure 2F:
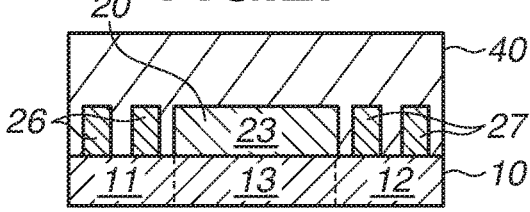

FIG. 2F illustrates a process "f" of forming a photoresist 40 on the center portion 23 of the member to be processed 20. The photoresist 40 is formed on the constituent members 26 and 27 as well.

Figure 2G:
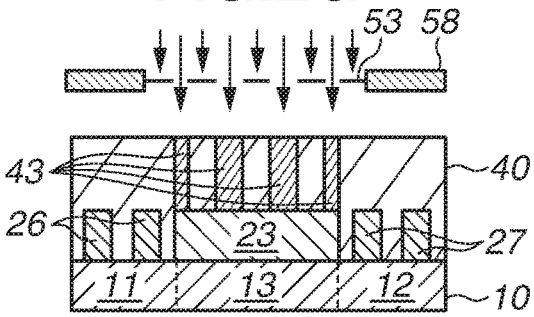

FIG. 2G illustrates a process "g" of exposing the photoresist 40 on the center portion 23 with use of a photomask 53. An exposed portion 43 is formed in the photoresist 40 through the exposure in the process "g". In the process "g", only the photoresist 40 within the maximum exposure range of the exposure apparatus is exposed with use of the photomask 53, and a portion of the photoresist corresponding to a non-exposure region 58 of the exposure apparatus is not exposed.

Figure 2H:
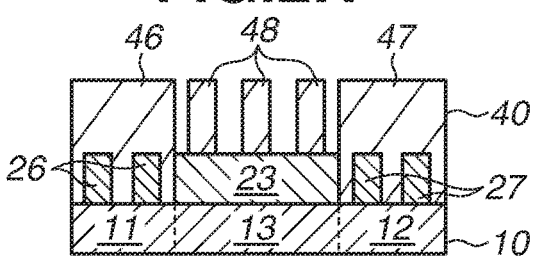

FIG. 2H illustrates a process "h" of developing the photoresist 40 to form a resist pattern 48 on the center portion 23. The resist pattern 48 is formed through removal of the exposed portion 43. In the process "h", a resist pattern 46 is formed from a portion of the photoresist 40 on the non-exposed peripheral circuit region 11 so as to cover the constituent member 26. In addition, a resist pattern 47 is formed from a portion of the photoresist 40 on the non-exposed peripheral circuit region 12 so as to cover the constituent member 27.

Figure 2I:
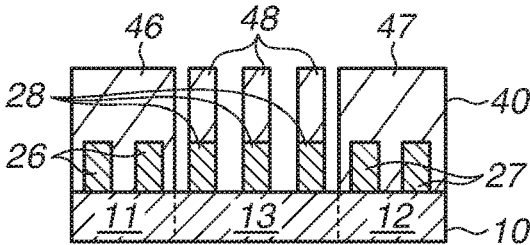

FIG. 2I illustrates a process "i" of etching the center portion 23 with use of the resist pattern 48 as a mask. A constituent member 28 configuring the pixel circuit section 101 is formed on the pixel circuit region 13 through the etching in the process "i". In the process "i", the resist pattern 46 masks the constituent member 26, and the resist pattern 47 masks the constituent member 27.

Figure 2J:
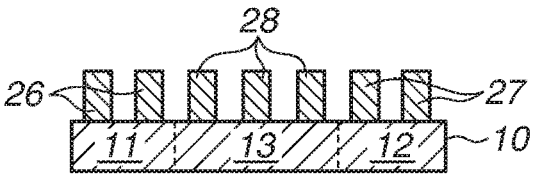

FIG. 2J illustrates a process "j" of removing the resist patterns 46, 47, and 48.

Figure 2K:
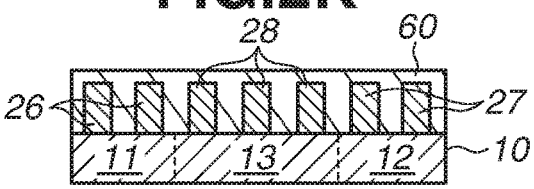

FIG. 2K illustrates a process "k" of forming a covering member 60 that covers the constituent members 26, 27, and 28. Thereafter, appropriate processing is performed on the covering member 60. The typical processing performed on the covering member 60 is planarization processing by, for example, a chemical mechanical polishing (CMP) method.

As described above, since the etching of the peripheral portions 21 and 22 and the etching of the center portion 23 are performed in the difference processes, it is possible to optimize the characteristics of each of the peripheral circuit sections 301 and 302 and the pixel circuit section 101. This allows for manufacture of the photoelectric conversion apparatus with improved performance.

In the above-described example, the processes "a" to are performed before the processes "f" to "j". Alternatively, the processes "a" to "e" can be performed after the processes "f" to "j". In this case, the constituent member 28 is first formed from the center portion 23, and the constituent members 26 and 27 are then formed from the peripheral portions 21 and 22, respectively.

Further generalization is performed on the above-described exemplary embodiment. In the etching of the member to be processed 20, exposure of the same photoresist is performed with use of M (M>2) photomasks for M regions of the peripheral circuit sections. Further, in the etching of the common member to be processed 20, the exposure of a different photoresist is performed with use of N (N>1) photomasks for N regions of the pixel circuit section. In the example of FIGS. 1A and 1B and FIGS. 2A to 2K, M is two and N is one; however, M can be equal to or larger than three and N can be equal to or larger than two. If division exposure is performed on the pixel circuit section 101, deviation at a boundary between the exposed regions easily appears in an image. Therefore, the division exposure is not to be performed on the pixel circuit section 101 (N=1), or the number of divided regions of the pixel circuit section 101 is to be smaller than the number of divided regions of the peripheral circuit section (M>N).

In the above-described example, the resist pattern 38 that masks the center portion 23 is formed with use of a part of the photoresist 30, and the resist patterns 46 and 47 that respectively mask the constituent members 26 and 27 are formed with use of a part of the photoresist 40. The center portion 23 (or constituent member 28) can be masked by a material different from a material of the photoresist 30 in place of the resist pattern 38. In addition, the constituent members 26 and 27 (or peripheral portions 21 and 22) can be masked by a material different from the material of the photoresist 30. Preparation of other masks, however, complicates the processes. Therefore, forming the resist patterns 38, 46, and 47 with use of the photoresists 30 and 40 is beneficial to productivity improvement.

In the above-described example, both of the photoresists 30 and 40 are of a positive type in which the exposed portion is removed through development; however, at least one of the photoresist 30 and the photoresist 40 can be of a negative type. When the negative photoresist is used, regions within the non-exposure ranges 56, 57, and 58 is exposed by any method in order to cause photoresists to remain in regions within the non-exposure ranges 56, 57, and 58, which increases the number of processes. For example, this corresponds to a case of causing the photoresists 30 and 40 to remain as the resist patterns 38, 46, and 47. Therefore, the positive photoresists 30 and 40 are used in the present exemplary embodiment. This is because using the positive photoresists 30 and 40 makes it possible to cause the photoresists 30 and 40 to remain as the resist patterns 38, 46, and 47 in the non-exposure ranges 56, 57, and 58 in the development process.

One of the process of etching the peripheral portion 21 and the peripheral portion 22 and the process of etching the center portion 23 is referred to as a succeeding etching process, and the other of the processes is referred to as a preceding etching process. The preceding etching process is performed before the succeeding etching process, and an end part of the member to be processed 20 formed in the preceding etching process is to be etched in the succeeding etching process. In the above-described process "i", the end parts of the center portion 23 on the constituent members 26 and 27 sides are etched. This is because the photomask 53 is designed such that the exposed portion 43 by the photomask 53 is formed at the end parts of the center portion 23. This makes it possible to surely etch the member to be processed 20 near a boundary between the center portion 23 and each of the peripheral portions 21 and 22 even if the photomasks 51 and 52 and the photomask 53 are misaligned. Accordingly, it is possible to suppress generation of a residue at the end part of the center portion 23 of the member to be processed 20 due to generation of an unintended non-exposed portion in the photoresist 40 near the boundary between the center portion 23 and each of the peripheral portions 21 and 22, and to suppress the residue from influencing a yield and an operation.

In one embodiment, the photoresist 40 has a thickness larger than a thickness of the photoresist 30. Making the photoresist 40 thick allows for reduction of etching damage occurred on the constituent members 26 and 27.

A wavelength of exposure light in the exposure of the photoresist 30 can be different from a wavelength of exposure light in the exposure of the photoresist 40. Making the wavelength of the exposure light in the exposure of the photoresist 30 lower than the wavelength of exposure light in the exposure of the photoresist 40 allows for miniaturization of the peripheral circuit sections 301 and 302 and an acceleration of an operation. The exposure light can be selected from a g-ray (wavelength of 436 nm), an i-ray (wavelength of 365 nm), a KrF excimer laser (wavelength of 248 nm), and an ArF excimer laser (wavelength of 193 nm).

In the etching of the member to be processed 20, execution of etching until a base (base body 10) of the member to be processed 20 is exposed is not essential depending on functions of the constituent members 26, 27, and 28. The constituent members 26, 27, and 28 can be coupled to one another by a lower part of the member to be processed 20.

In one embodiment, bias power of the etching in the process "j" of etching the center portion 23 is lower than bias power of the etching in the process of etching the peripheral portion 21 and the peripheral portion 22. This makes it possible to reduce noise caused by etching damage occurred on the pixel circuit section 101.

Application examples of the member to be processed 20 are described below. The member to be processed 20 is typically one of a conductor and an insulator, and the covering member 60 is typically the other of the conductor and the insulator. Alternatively, the member to be processed 20 is a semiconductor, and the covering member 60 is one of the conductor and the insulator.

In a first example, each of the constituent members 26, 27, and 28 formed from the member to be processed 20 is a gate electrode of a transistor. The member to be processed 20 in this case is a polysilicon film, and the covering member 60 is an interlayer insulation film.

In a second example, each of the constituent members 26, 27, and 28 is a wiring or a light shielding member. The member to be processed 20 in this case is a metal film, and the covering member 60 is an interlayer insulation film.

In a third example, each of the constituent members 26, 27, and 28 is an insulation member configuring a concave part. In the process "e" of etching the peripheral portion 21 and the peripheral portion 22, a first concave part is formed in the peripheral portion 21, and a second concave part is formed in the peripheral portion 22. The first concave part is a clearance in the constituent member 26, and the second concave part is a clearance in the constituent member 27. In the process "i" of etching the center portion 23, a third concave part is formed in the center portion 23. The third concave part is a clearance in the constituent member 28. The covering member 60 formed in the process "k" is an electroconductive member disposed in the first concave part, the second concave part, and the third concave part. The electroconductive member in each of the concave parts is used as a contact plug or a wiring including a damascene structure.

In a fourth example, the member to be processed is a semiconductor substrate. In the process "e" of etching the peripheral portion 21 and the peripheral portion 22, the first concave part is formed in the peripheral portion 21, and the second concave part is formed in the peripheral portion 22. In the process "i" of etching the center portion 23, the third concave part is formed in the center portion 23. The covering member 60 formed in the process "k" is an insulation member disposed in the first concave part, the second concave part, and the third concave part. The insulation member in each of the concave parts is used as a device separation part including a shallow trench isolation (STI) structure.

The manufacturing method according to the present exemplary embodiment is applicable to a plurality of kinds of members. For example, the manufacturing method according to the present exemplary embodiment is applicable to both of formation of the device separation part and formation of the gate electrode. Alternatively, the manufacturing method according to the present exemplary embodiment is applicable to both of formation of the gate electrode and formation of the contact plug. Alternatively, the manufacturing method according to the present exemplary embodiment is applicable to both of formation of the contact plug and formation of the wiring.

In this case, in the etching of a first kind of the member to be processed 20, a mask pattern included in the photomask 51 to be used in the exposure on the peripheral circuit region 11 is used to form the alignment mark 251. Likewise, a mask pattern included in the photomask 52 to be used in the exposure on the peripheral circuit region 12 is used to form the alignment mark 252. A mask pattern included in the photomask 53 to be used in the exposure on the pixel circuit region 13 is used to form the alignment mark 253. Thereafter, when the manufacturing method according to the present exemplary embodiment is applied to process a different second kind of member to be processed, the alignment mark 251 is used for alignment and the exposure on the peripheral circuit region 11 is performed. Likewise, the alignment mark 252 is used for alignment and the exposure on the peripheral circuit region is performed. The alignment mark 253 is used for alignment and the exposure on the pixel circuit region 13 is performed. This makes it possible to acquire favorable superposition accuracy even when exposure is divided and performed three times. The second kind of member to be processed can be a semiconductor substrate, and the processing performed on the member to be processed in this case can be ion implantation processing without being limited to etching.

Although the photoelectric conversion apparatus IC has been exemplified in this case, the manufacturing method according to the present exemplary embodiment is applicable to a method of manufacturing a semiconductor apparatus mounted with a memory array and a logic circuit, a semiconductor apparatus mounted with an analog circuit and a digital circuit, and the like, in addition to the photoelectric conversion apparatus.

More specific exemplary embodiments are described below. The photoelectric conversion apparatus IC is used as an imaging apparatus of a two-dimensional image input apparatus centering on a digital still camera and a video camcorder. As the imaging apparatus, the photoelectric conversion apparatus such as a charge-coupled device (CCD) sensor and a complementary metal-oxide semiconductor (CMOS) sensor is used. A sensor used in the digital still camera can have a large size including an advanced photo system type-c (APS-C) size to a 35 mm film size.

Such a photoelectric conversion apparatus having a large size includes the pixel circuit section 101 and the peripheral circuit sections 301 and 302. The pixel circuit section 101 includes a photoelectric conversion device that photoelectrically converts entering light into an electric signal. The peripheral circuit sections 301 and 302 are provided around the pixel circuit section 101. In the photoelectric conversion apparatus having a large area that exceeds the maximum exposure range (e.g., 26 mm×33 mm) of the exposure apparatus, the division exposure in which the entire exposure region is divided with use of a plurality of photomasks (reticles), and the divided exposure regions are connected to form the entire pattern can be used. In the method of dividing and exposing the pixel circuit section 101 as described above, however, misalignment may occur at a boundary between the divided exposure regions due to an alignment error of the exposure apparatus, and line width difference may occur due to separate exposure of the plurality of photomasks. Accordingly, an issue of a pixel characteristic difference and discontinuity of the divided exposure regions may occur at the boundary between the divided exposure regions.

To suppress the issue of the pixel characteristic difference and the discontinuity occurred between the divided exposure regions in the division exposure, for example, collective exposure can be performed on the pixel circuit 101 and the division exposure can be performed on the peripheral circuit sections 301 and 302. When only the exposure process is divided for the pixel circuit section 101 and for the peripheral circuit sections 301 and 302, however, the pixel circuit section 101 and the peripheral circuit sections 301 and 302 thereafter are processed in the same etching process. If an etching condition of the peripheral circuit sections 301 and 301 requiring high-speed operation is applied to the pixel circuit section 101, the pixel characteristics are acutely influenced by damage caused by etching. As a result, an issue of deterioration in the sensor characteristics, for example, noise may newly occur.

A method of manufacturing the photoelectric conversion apparatus is described with reference to FIGS. 3A to 3M. In FIGS. 3A to 3M, the pixel circuit section 101 and the peripheral circuit sections 301 and 302 are adjacently illustrated for description. In this case, a process flow applied to a process of forming the gate electrode is described.

In a process "S-a" illustrated in FIG. 3A, a device separation part 103 is formed on a semiconductor substrate 100 including silicon through, for example, STI or a local oxidation of silicon (LOCOS) method. Thereafter, first conductive (p-type) wells 117 and 127, a second conductive (n-type) semiconductor region of a photoelectric conversion device 113, and a first conductive (p-type) well contact 701 are formed through a silicon oxide film 104.

In a process "S-b" illustrated in FIG. 3B, after the silicon oxide film 104 is removed, a gate insulation film 105 of the transistor of the pixel circuit section 101 and a gate insulation film 106 of a transistor of each of the peripheral circuit sections 301 and 302 are formed. A silicon oxynitride film can be used for the gate insulation film 105 of the pixel circuit section 101 and the gate insulation film 106 of each of the peripheral circuit sections 301 and 302. The gate insulation films 105 and 106 are formed, as silicon oxynitride films, through formation of a silicon oxide film as a base followed by oxynitriding treatment of the silicon oxide film. For example, in this case, the silicon oxide film as the base is formed through thermal oxidation by a wet method. The gate insulation film 105 is formed with a thickness of about 7.5 nm as a transistor for 3.3 V, and the gate insulation film 106 is formed with a thickness of about 2.1 nm as a transistor for 1.2 V.

In a process "S-c" illustrated in FIG. 3C, a polysilicon film 107 serving as a gate electrode and a silicon oxide film 108 serving as a hard mask are deposited.

In a process "S-d" illustrated in FIG. 3D, a photoresist 401 for formation of the peripheral circuit sections 301 and 302 is applied to the entire surface of the wafer.

In a process "S-e" illustrated in FIG. 3E, a region of the photoresist 401 corresponding to the peripheral circuit section 301 is exposed to form an exposed portion 402.

In a process "S-f" illustrated in FIG. 3F, a region of the photoresist 401 corresponding to the peripheral circuit section 302 is exposed to form an exposed portion 403.

In a process "S-g" illustrated in FIG. 3G, the exposed photoresist 401 is developed to form a resist pattern on each of peripheral circuit sections 301 and 302.

In a process "S-h" illustrated in FIG. 3H, etching processing is performed on the peripheral circuit sections 301 and 302 with use of the resist masks and the hard mask, to form patterns serving as the gate electrodes of the respective peripheral circuit sections 301 and 302.

In a process "S-i" illustrated in FIG. 3I, a photoresist 501 for formation of the pixel circuit section 101 is applied to the entire surface of the wafer. At this time, to prevent breakage of the photoresist of the peripheral circuit and breakage of the photoresist pattern in subsequent etching of the pixel circuit section 101, the peripheral circuit pattern after application of the photoresist 501 is surely covered. Therefore, the photoresist 501 is to be made as thick as possible, and has a thickness larger than at least a thickness of the photoresist 401.

Figure 3J:
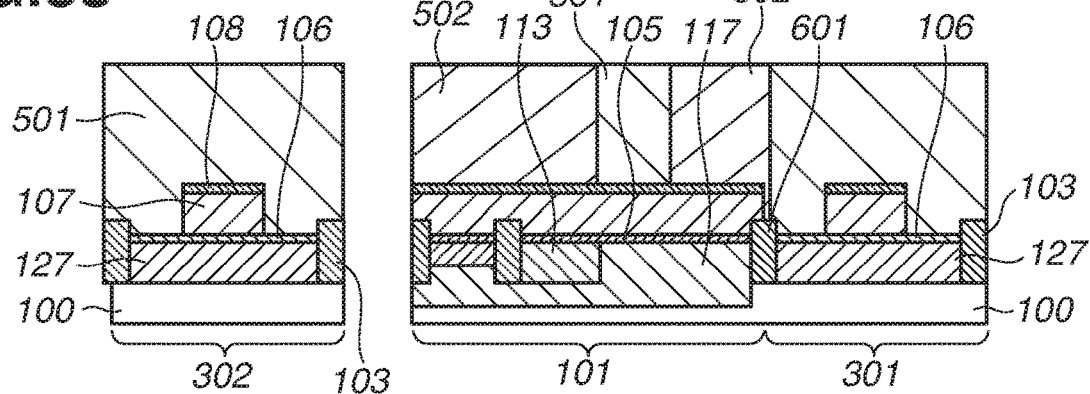

In a process "S-j" illustrated in FIG. 3J, a region of the photoresist 501 corresponding to the pixel circuit section 101 is exposed to form an exposed portion 502.

Figure 3K:
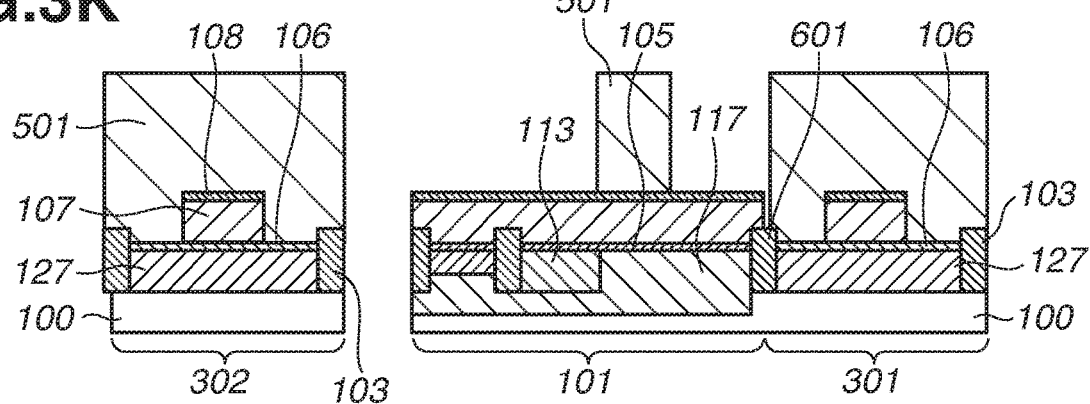

In a process "S-k" illustrated in FIG. 3K, the exposed photoresist 501 is developed.

Figure 3L:
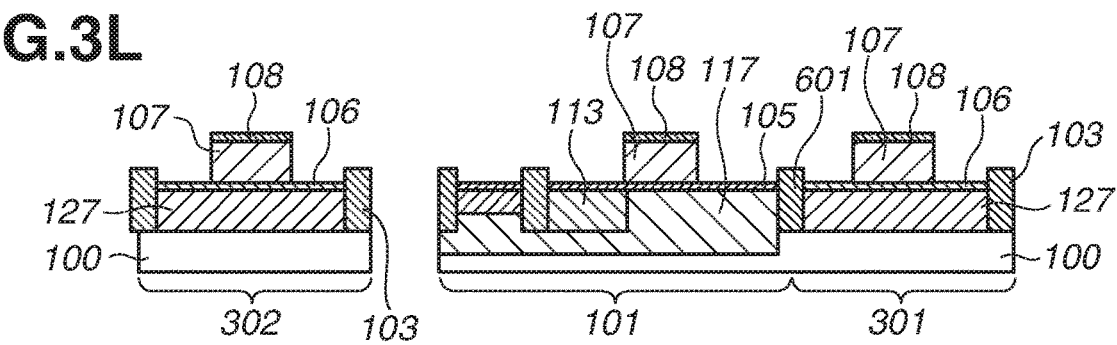

In a process "S-l" illustrated in FIG. 3L, etching processing is performed with use of the resist pattern and the hard mask including the silicon oxide film 108, to pattern the polysilicon film 107 of the pixel circuit section 101.

Figure 3M:
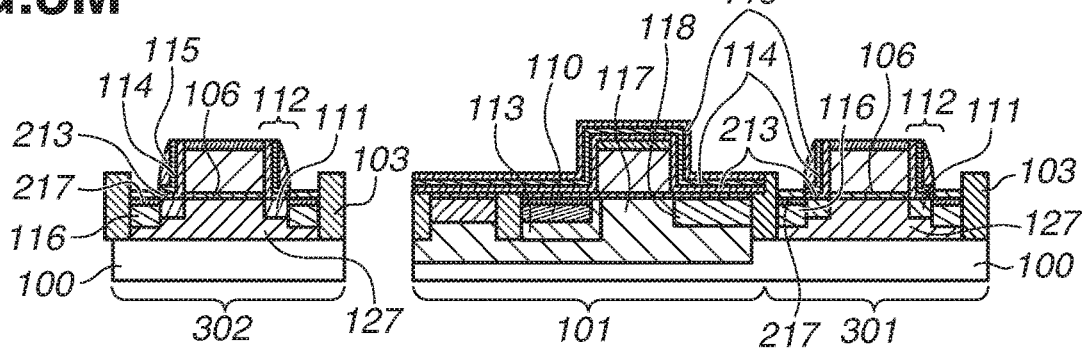

In a process "S-m" illustrated in FIG. 3M, a p-type surface region 110 and a second conductive (n-type) semiconductor region 118 with low impurity concentration serving as a single drain structure of the pixel circuit section 101 are formed. Thereafter, a low impurity region 111 serving as a lightly doped drain (LDD) structure is formed. For example, boron difluoride ($BF_2$), boron (B), or indium (In) is used for the low impurity region 111 of p-channel metal oxide semiconductor (PMOS). For example, arsenic (As) or phosphorous (P) is used for the low impurity region 111 of n-channel metal oxide semiconductor (NMOS). As described above, it is possible to control shallow LDD implantation for the high-speed transistor of the peripheral circuit, and to realize both of the high-speed transistor having driving force and sensor characteristics. In addition, a silicon oxide film 213, a silicon nitride film 114, and a silicon oxide film 115 are formed, and a resist is formed on the pixel circuit section 101 and is etched back. As a result, a side wall including a part of the silicon oxide films 213 and 115 and the silicon nitride film 114 is formed on the peripheral circuit. Further, a resist is formed in the pixel circuit section 101, and a high-concentration impurity region 116 that configures a source/drain self-aligned to a side surface of the side wall is formed in each of the peripheral circuit sections 301 and 302. Then, a silicide layer 217 using cobalt or the like is formed in each of the peripheral circuit sections 301 and 302 with use of, as a protective film, the silicon oxide film 213, the silicon nitride film 114, and the silicon oxide film 115 that remain in the pixel circuit section 101.

The polysilicon film is normally etched through anisotropic dry etching under a condition that mixed gas of $Cl_2$, $O_2$, HBr, and the like is used and bias power of about 100 W to about 2000 W is applied to an upper electrode and a lower electrode. The higher bias power having strong anisotropy is applied as processing of design formation becomes fine. Therefore, if such high bias power having strong anisotropy is used for the center portion, etching damage occurs on the photodiode, which causes deterioration in pixel characteristics, in particular, in noise characteristics.

After formation of the transistor, the photoelectric conversion apparatus is manufactured through a wiring process, a color filter process, a microlens process, a dicing process, and a packaging process.

According to the above-described manufacturing method, it is possible to divide the etching process for the pixel circuit section 101 and for the peripheral circuit sections 301 and 302. Therefore, even if the etching processing using high bias power is performed for microfabrication of the peripheral circuit sections 301 and 302, it is possible to suppress damage to the pixel circuit section 101. The microfabrication at the same degree as the peripheral circuit sections 301 and 302 is unnecessary for the pixel circuit section 101 of a full-size sensor having a large area. Accordingly, in the process "S-l", a bias power condition can be lower than the etching condition of the peripheral circuit sections 301 and 302 in the process "S-h". As a result, it is possible to further suppress damage to the photodiode that occurs in the etching of the gate electrode.

In addition, the area exposed by the conventional exposure apparatus is insufficient for collective exposure of the pixel circuit section 101, and it is difficult to perform the collective exposure because increase in the number of pixels is required. Accordingly, in the process "S-j", an exposure apparatus that has a collective exposure range larger than that of the conventional exposure apparatus is used. On the other hand, resolution may become lower by the exposure apparatus having the large exposure range. Therefore, for the peripheral circuit sections 301 and 302 requiring fine pattern in the process "S-e" and the process "S-f", to use the conventional exposure apparatus that has the small exposure range but has the high resolution. In other words, the exposure apparatus, where the wavelength of the exposure light is shorter, is usable as the exposure apparatus with higher resolution.

In addition, the boundary between the pixel circuit section 101 and the peripheral circuit section 301 or the boundary between the pixel circuit section 101 and the peripheral circuit section 302 can be disposed on the device separation part 103. In and after FIG. 3H, an insulator of the device separation part 103 located below the boundary between the pixel circuit section 101 and the peripheral circuit section 301 or the boundary between the pixel circuit section 101 and the peripheral circuit section 302 is illustrated as a boundary part 601. The exposure is performed while a margin is set in the exposure region such that the exposed portion 402 in the process "S-e" and the exposed portion 502 in the process "S-k" are overlapped with each other. As a result, an opening of the photoresist 501 is formed on the end part of the polysilicon film 107 in the process "S-k", and the etching processing is surely performed on the end part of the polysilicon film 107 on a boundary part 801 in the process "S-l". As a result, it is possible to suppress a residue of the polysilicon film 107 from being generated near the boundary part 601.

The exposure is performed such that the exposed portion 402 in the process "S-e" and the exposed portion 502 in the process "S-j" are overlapped with each other, and the etching processing is performed twice in the process "S-h" and the process "S-l". Therefore, the boundary part 601 on the peripheral circuit section 301 side is etched in the etching of the peripheral circuit section 301. The boundary part 601 on the pixel circuit section 101 side is etched in the etching of the pixel circuit section 101. Thus, the vicinity of the center of the boundary part 601 is etched twice in an overlapping manner and is accordingly etched by a large amount as compared with the boundary part 601 on the peripheral circuit section 301 side and the boundary part 601 on the pixel circuit section 101 side. As a result, a concave part may be formed in the vicinity of the center of the boundary part 601. As described above, however, the etching of the peripheral circuit section 301 illustrated in the process "S-h" can use the bias power higher than that in the etching of the pixel circuit section 101 illustrated in the process "S-l". In this case, the insulator of the boundary part 601 on the pixel circuit section 101 side is not etched so much in the etching of the pixel circuit section 101. The boundary part 601 on the peripheral circuit section 301 is made higher than the boundary part 601 on the pixel circuit section 101. In other words, in considering the vicinity of the center of the boundary part 601 as a basis, concave parts different in height are generated on both sides of the vicinity of the center. In the present exemplary embodiment, such trace remains in the boundary part 601. Therefore, it is possible to check, through observation of the boundary part 601, whether the manufacturing method of the present exemplary embodiment is appropriately performed, which helps improvement of yield.

The disclosed contents of the present exemplary embodiment include not only the matter described in the present specification but also all of matters understood from the drawings. The present exemplary embodiment can be modified without departing from its technical concept.

The aspect of the embodiments makes it possible to manufacture the semiconductor apparatus with improved performance.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2017-095951, filed May 12, 2017, which is hereby incorporated by reference herein in its entirety.

What is claimed is:

1. A method of manufacturing a semiconductor apparatus including a first circuit section and a second circuit section, the method comprising:
    forming a member which includes a first portion, a second portion and a third portion, the first portion and the second portion being for the first circuit section, the third portion being for the second circuit section;
    forming a first photoresist on each of the first portion and the second portion of the member;
    exposing the first photoresist on the first portion using a first photomask;
    exposing the first photoresist on the second portion using a second photomask;
    forming a first resist pattern by developing the first photoresist on the first portion and the second portion;
    etching the first portion and the second portion using the first resist pattern as a mask;
    forming a second photoresist on the third portion of the member;
    exposing the second photoresist on the third portion using a third photomask;
    forming a second resist pattern by developing the second photoresist on the third portion; and
    etching the third portion using the second resist pattern as a mask,
    wherein no conductor is formed on the member between the forming of the first photoresist and the forming of the second photoresist.

2. The method according to claim 1, wherein a resist pattern masks the first portion and the second portion in the etching the third portion.

3. The method according to claim 1, wherein the forming the second photoresist is performed after the etching the first portion and the second portion.

4. The method according to claim 1, wherein the second photoresist has a thickness larger than a thickness of the first photoresist.

5. The method according to claim 1, wherein a gate electrode of a transistor is formed from the member.

6. The method according to claim 1, further comprising disposing an electroconductive member in each of a first concave part, a second concave part, and a third concave part,
    wherein the member includes an insulation member,
    wherein the first concave part is formed in the first portion and the second concave part is formed in the second portion in the etching the first portion and the second portion, and
    wherein the third concave part is formed in the third portion in the etching the third portion.

7. The method according to claim 1, wherein a wavelength of exposure light in the exposing the first photoresist is shorter than a wavelength of exposure light in the exposing the second photoresist.

8. The method according to claim 1, wherein bias power in the etching the third portion is lower than bias power in the etching the first portion and the second portion.

9. The method according to claim 1, wherein a device separation part is located below a boundary between the first portion and the third portion.

10. The method according to claim 1, wherein, in one of the etching the first portion and the second portion and the etching the third portion, an end part of the member that is formed in the other of the etching the first portion and the second portion and the etching the third portion is etched.

11. The method according to claim 1,
    wherein, in the etching the first portion and the second portion, a first alignment mark is formed by a mask pattern included in the first photomask, and a second alignment mark is formed by a mask pattern included in the second photomask, and
    wherein, in the etching the third portion, a third alignment mark is formed by a mask pattern included in the third photomask.

12. The method according to claim 1, wherein each of the first photoresist and the second photoresist is of a positive type.

13. The method according to claim 1, further comprising obtaining a plurality of semiconductor chips by dicing a semiconductor wafer including a constituent member obtained through patterning of the member, the semiconductor chips each including the first circuit section and the second circuit section.

14. The method according to claim 1, wherein the semiconductor apparatus is a photoelectric conversion apparatus including a pixel circuit section and a peripheral circuit section, the first portion and the second portion each serve as the peripheral circuit section, and the third portion serves as the pixel circuit section.

15. The method according to claim 1, wherein the first photoresist is exposed using a first exposure apparatus having a first maximum exposure range and a first non-exposure range, the first photoresist is exposed within the first maximum exposure range using the first photomask, and is not exposed within the first non-exposure range.

16. The method according to claim 15, wherein the first photoresist is exposed using the first exposure apparatus having a second maximum exposure range and a second non-exposure range, the first photoresist is exposed within the second maximum exposure range using the second photomask, and is not exposed within the second non-exposure range.

17. The method according to claim 16, wherein the second maximum exposure range is at least a part of the first non-exposure range.

18. The method according to claim 17, wherein the second non-exposure range is at least a part of the first maximum exposure range.

19. The method according to claim 18, wherein the second photoresist is exposed using a second exposure apparatus having a third maximum exposure range and a third non-exposure range, the second photoresist is exposed within the third maximum exposure range using the third photomask, and is not exposed within the third non-exposure range.

20. The method according to claim 1, wherein a part of the first photoresist on the second portion and the third portion is not exposed in the exposing the first photoresist on the first portion, a part of the first photoresist on the first portion and the third portion is not exposed in the exposing the first photoresist on the second portion, and a part of the second photoresist on the first portion and the second portion is not exposed in the exposing the second photoresist on the third portion.

* * * * *